(12) United States Patent
Tsai

(10) Patent No.: US 9,887,188 B2
(45) Date of Patent: Feb. 6, 2018

(54) ELECTRO-STATIC DISCHARGE STRUCTURE, CIRCUIT INCLUDING THE SAME AND METHOD OF USING THE SAME

(71) Applicant: TAIWAN SEMICONDUCTOR MANUFACTURING COMPANY, LTD., Hsinchu (TW)

(72) Inventor: Ming Hsien Tsai, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 122 days.

(21) Appl. No.: 14/600,745

(22) Filed: Jan. 20, 2015

(65) Prior Publication Data

US 2016/0211253 A1    Jul. 21, 2016

(51) Int. Cl.
H02H 9/04    (2006.01)
H01L 27/02    (2006.01)

(52) U.S. Cl.
CPC ......... *H01L 27/0255* (2013.01); *H02H 9/044* (2013.01)

(58) Field of Classification Search
CPC ...... H01L 27/0255; H02H 9/04; H02H 9/041; H02H 9/046
USPC ........................................................... 361/56
See application file for complete search history.

(56) References Cited

U.S. PATENT DOCUMENTS 6,144,542 A * 11/2000 Ker .................. H01L 27/0251
361/111
6,671,153 B1 * 12/2003 Ker .................. H01L 27/0262
361/111
6,674,129 B1 * 1/2004 Colclaser ........... H01L 27/0255
257/355
6,822,295 B2 * 11/2004 Larson .............. H01L 27/0255
257/355
7,071,514 B1    7/2006 Ozard
7,594,198 B2    9/2009 Chen
7,616,414 B2 * 11/2009 Marholev ............ H01Q 1/50
361/111

(Continued)

FOREIGN PATENT DOCUMENTS

DE    102010050764    5/2012
JP    02-268460    11/1990

(Continued)

OTHER PUBLICATIONS

Office Action dated Dec. 30, 2016 from corresponding application No. TW 104139093.

(Continued)

*Primary Examiner* — Dharti Patel
(74) *Attorney, Agent, or Firm* — Hauptman Ham, LLP

(57) ABSTRACT

An electro-static discharge (ESD) structure includes an input pad, and a first switching device electrically connected to the input pad. The ESD structure further includes a first diode, wherein the first switching device is configured to selectively connect the first diode to the input pad, and the first diode is configured to provide a first dissipation path for an ESD event at the input pad. The ESD structure further includes a second diode selectively connectable to the input pad, wherein the second diode is configured to provide a second dissipation path for the ESD event at the input pad.

21 Claims, 5 Drawing Sheets

(56) References Cited

U.S. PATENT DOCUMENTS

| | | | |
|---|---|---|---|
| 7,719,806 B1 * | 5/2010 | Boyd | H01L 27/027 361/56 |
| 8,324,658 B2 | 12/2012 | Tsai et al. | |
| 8,334,571 B2 | 12/2012 | Tsai et al. | |
| 8,541,848 B2 | 9/2013 | Huang et al. | |
| 8,698,139 B2 * | 4/2014 | Bazarjani | H01L 23/60 257/48 |
| 8,730,626 B2 | 5/2014 | Tseng et al. | |
| 8,743,515 B2 | 6/2014 | Yang et al. | |
| 8,759,871 B2 | 6/2014 | Song et al. | |
| 8,760,828 B2 | 6/2014 | Ma | |
| 8,792,218 B2 | 7/2014 | Tsai | |
| 8,854,778 B2 | 10/2014 | Chu et al. | |
| 8,867,183 B2 | 10/2014 | Chen et al. | |
| 2001/0017755 A1 | 8/2001 | Toyoshima | |
| 2004/0136126 A1 * | 7/2004 | Smith | H01L 27/0251 361/56 |
| 2005/0286188 A1 * | 12/2005 | Camp | H01L 27/0262 361/56 |
| 2006/0274464 A1 | 12/2006 | Chen | |
| 2010/0149703 A1 * | 6/2010 | Yeh | H01L 27/0266 361/56 |
| 2010/0246078 A1 * | 9/2010 | Utagawa | H03F 3/45475 361/56 |
| 2011/0051299 A1 * | 3/2011 | Hiraoka | H01L 27/0255 361/56 |
| 2011/0096446 A1 * | 4/2011 | Croft | H01L 27/0251 361/56 |
| 2013/0093052 A1 | 4/2013 | Ma et al. | |
| 2013/0119433 A1 | 5/2013 | Wang | |
| 2013/0170080 A1 | 7/2013 | Chen | |
| 2013/0342941 A1 | 12/2013 | Wang et al. | |
| 2014/0118869 A1 | 5/2014 | Meng et al. | |
| 2014/0151809 A1 * | 6/2014 | Lin | H01L 27/0255 257/355 |
| 2014/0175611 A1 | 6/2014 | Hsu | |
| 2014/0183518 A1 | 7/2014 | Tsai et al. | |
| 2014/0210014 A1 | 7/2014 | Ma et al. | |
| 2014/0217461 A1 | 8/2014 | Song et al. | |
| 2014/0226241 A1 | 8/2014 | Tseng et al. | |
| 2014/0307355 A1 | 10/2014 | Tsai et al. | |
| 2015/0228770 A1 * | 8/2015 | Lin | H01L 29/87 257/173 |

FOREIGN PATENT DOCUMENTS

| | | |
|---|---|---|
| JP | 2000-150801 | 5/2000 |
| JP | 2001-133213 | 5/2001 |
| JP | 2002-246599 | 8/2002 |
| KR | 1020010102293 | 11/2001 |
| KR | 1020020082400 | 10/2002 |
| KR | 20040111318 | 12/2004 |
| TW | 201025549 | 7/2010 |
| WO | WO2001047017 | 6/2001 |

OTHER PUBLICATIONS

Office Action dated Mar. 21, 2017 from corresponding application No. KR 10-2015-0165714.

Office Action dated Nov. 27, 2017 from corresponding application No. CN 201510390781.4.

* cited by examiner

ELECTRO-STATIC DISCHARGE STRUCTURE, CIRCUIT INCLUDING THE SAME AND METHOD OF USING THE SAME

BACKGROUND

Electro-static discharge (ESD) structures are used to dissipate power surges within circuits to reduce a risk of damage to functional circuitry from a sharp increase in current or voltage. ESD structures connect an input signal to at least one of an operational voltage or a reference voltage in order to dissipate power surges.

In some instances, ESD structures include diodes which provide low resistance between an input pad receiving the input signal and the operational voltage or reference voltage once a power level at the input pad exceeds a threshold value. In some embodiments, multiple diodes connect the input pad to the operational voltage or reference voltage to provide multiple paths for power dissipation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
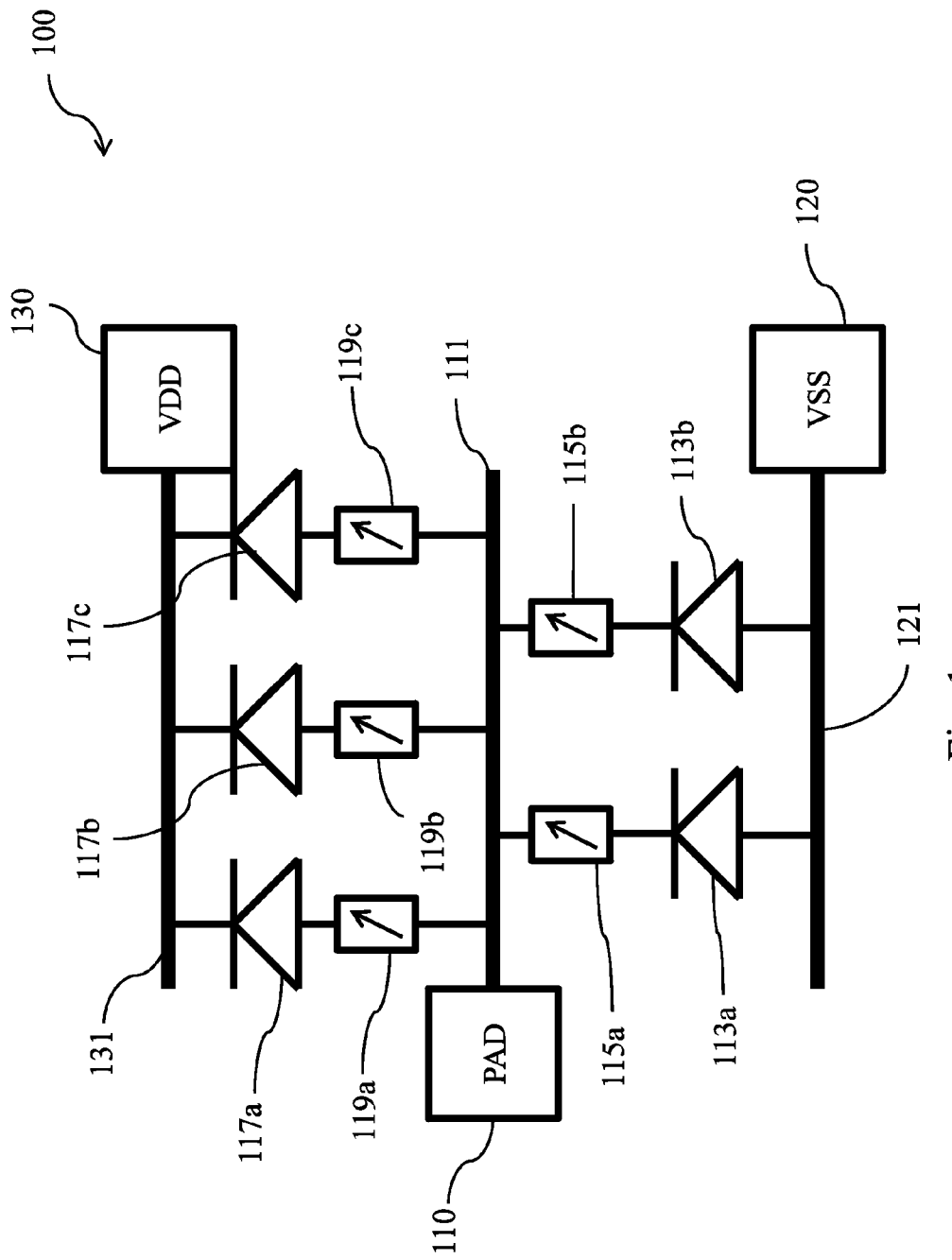
FIG. 1 is a schematic diagram of an electro-static discharge (ESD) structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of an electro-static discharge (ESD) structure 100 in accordance with some embodiments. ESD structure 100 includes an input pad 110 configured to receive an input signal. An input line 111 is electrically connected to input pad 110. In some embodiments, input line 111 is a bus including a plurality of electrical conductive paths. Each of a first plurality of diodes 113a-113b is selectively connectable to input line 111 by a corresponding switching device of a first plurality of switching devices 115a-115b. Each of a second plurality of diodes 117a-117c is selectively connectable to input line 111 by a corresponding switching device of a second plurality of switching devices 119a-119c. First plurality of diodes 113a-113b is configured to electrically connect input line 111 to a reference voltage 120 through a reference voltage line 121. Second plurality of diodes 117a-117c is configured to electrically connect input line 111 to an operational voltage 130 through an operational voltage line 131. Although, in FIG. 1, ESD structure 100 includes two of the first plurality of diodes and three of the second plurality of diodes, any number of the first plurality of diodes or the second plurality of diodes is within the scope of various embodiments.

Input pad 110 is an input/output (I/O) device for ESD 100. A functional circuit (not shown) is also configured to receive information from input pad 110. The functional circuit is configured to process an input signal received at input pad 110. In some instances during operation, an ESD event results in a sharp increase of current or voltage at input pad 110. ESD structure 100 is configured to dissipate the power from the ESD event in order to help protect the functional circuit from damage due to the ESD event. As technology nodes decrease and gate dielectric layers become thinner, the sensitivity of the functional circuit to ESD events increases.

ESD structures impact performance of the functional circuit due to parasitic capacitance or parasitic resistance, in some instances. The performance impact includes a reduction in a speed of the functional circuit or an increased power consumption by the functional circuit. As a number of paths for dissipating the ESD event increase, protection for the functional circuit increases. However, an increase in the number of paths for dissipating the ESD event also increases the impact on the performance of the functional circuit. Accurately determining the parasitic impact of an ESD structure on functional circuits is difficult. As a result, circuit designers face a challenge of providing sufficient ESD protection for functional circuits without an accurate model for determining how the ESD structure will impact the performance of the functional circuit. In some instances, the ESD structure is overdesigned which needlessly reduces performance of the functional circuit. In some instances, the ESD structure is designed in a manner which does not sufficiently protect the functional circuit which reduces reliability of an end product.

ESD structure 100 helps to provide sufficient protection for the functional circuit, while reducing an impact on the performance of the functional circuit. First plurality of switching devices 115a-115b avoid first plurality of diodes 113a-113b being electrically connected to the functional circuit connected to input line 111 during an entirety of operation of ESD structure 100. In addition, second plurality of switching devices 119a-119c avoid first plurality of diodes 117a-117c being electrically connected to the functional circuit connected to input line 111 during an entirety of operation of ESD structure 100. As a result, the impact on the performance of the functional circuit is reduced in comparison with structures which lack switching devices. The decreased impact on performance of the functional circuit in turn permits overdesign of ESD structure 100 to help guarantee sufficient protection for the functional circuit while maintaining a requested performance of the functional circuit.

Input pad 110 is a conductive element for receiving the input signal. In some embodiments, input pad 110 is part of an interconnect structure. In some embodiments, input pad 110 is an I/O pin. In some embodiments, input pad 110 is configured to electrically connect to a separate chip in a three-dimensional integrated circuit (3DIC).

Input line 111 is configured to carry the input signal from input pad 110 to the functional circuit and to the other elements of ESD structure 100. In some embodiments, input line 111 is part of an interconnect structure. In some embodiments, input line 111 and input pad 110 are part of a same interconnect structure. In some embodiments, input line 111 and input pad 110 are part of different interconnect structures. In some embodiments, input line 111 is on a same metal level, i.e., a same distance from a top surface of a substrate, as input pad 110. In some embodiments input line 111 is on a different metal level from input pad 110.

Each diode of first plurality of diodes 113a-113b is configured to provide a low resistance path from a corresponding switching device of first plurality of switching devices 115a-115b once a power at a terminal of the corresponding diode exceeds a threshold value. ESD structure 100 includes diode 113a and diode 113b. In some embodiments, ESD structure 100 includes more than two diodes connected to reference voltage line 121.

In some embodiments, diode 113a has a same structure as diode 113b. In some embodiments, diode 113a has a different structure from diode 113b. In some embodiments, diode 113a is capable of passing a higher current than diode 113b. In some embodiments, diode 113a has different channel dimensions from diode 113b. Diode 113a being able to pass a higher current than diode 113b permits a greater degree of tuning within ESD structure 100. For example, if a power dissipation requirement during the ESD event is greater than a power dissipation capacity than diode 113b, then switching device 115a is able to be activated in order to dissipate the ESD event while avoiding activating switching device 115b. This reduces the impact on the performance of the functional circuit while maintaining sufficient protection for the functional circuit. In some embodiments, first plurality of diodes 113a-113b has n-type conductivity. In some embodiments, first plurality of diodes 113a-113b has p-type conductivity.

Each switching device of first plurality of switching devices 115a-115b is configured to selectively connect a corresponding diode of first plurality of diodes 113a-113b to input line 111. ESD structure 100 includes a one-to-one correspondence between first plurality of switching devices 115a-115b and first plurality of diodes 113a-113b. In some embodiments, a single switching device is configured to selectively connect more than one diode to input line 111.

In some embodiments, at least one switching device of first plurality of switching devices 115a-115b includes a metal fuse, a polysilicon fuse, a complementary transmission gate, a p-type transmission gate, an n-type transmission gate, an LC resonator, or another suitable switching devices. In some embodiments, the LC resonator includes an inductor connected in parallel with a capacitor. In some embodiments, the LC resonator includes an inductor connected in series with a capacitor. An LC resonator is able to function as a switching device because a frequency which passes through the LC resonator is equal to $(LC)^{-0.5}$ regardless of whether the inductor and capacitor are in parallel or in series. In some embodiments, a design of switching device 115a is a same design as switching device 115b. In some embodiments, the design of switching device 115a is different from the design of switching device 115b.

Each diode of second plurality of diodes 117a-117c is configured to provide a low resistance path from a corresponding switching device of second plurality of switching devices 119a-119c once a power at a terminal of the corresponding diode exceeds a threshold. ESD structure 100 includes diode 117a, diode 117b and diode 117c. In some embodiments, ESD structure 100 includes more or less than three diodes connected to operational voltage line 131.

In some embodiments, diode 117a has a same structure as at least one of diode 117b or diode 117c. In some embodiments, diode 117a has a different structure from at least one of diode 117b or diode 117c. In some embodiments, diode 117a is capable of passing a higher current than at least one of diode 117b or diode 117c. In some embodiments, diode 117a has different channel dimensions from at least one of diode 117b or 117c. In some embodiments, second plurality of diodes 117a-117c has n-type conductivity. In some embodiments, second plurality of diodes 117a-117c has p-type conductivity.

In some embodiments, all diodes of second plurality of diodes 117a-117c have a same structure as all diodes of first plurality of diodes 113a-113b. In some embodiments, at least one diode of second plurality of diodes 117a-117c has a different structure from at least one diode of first plurality of diodes 113a-113b. ESD structure 100 includes fewer diodes in first plurality of diodes 113a-113b than in second plurality of diodes 117a-117c. In some embodiments, first plurality of diodes 113a-113b includes a same number of diodes as second plurality of diodes 117a-117c. In some embodiments, first plurality of diodes 113a-113b includes more diodes than second plurality of diodes 117a-117c.

Each switching device of second plurality of switching devices 119a-119c is configured to selectively connect a corresponding diode of second plurality of diodes 117a-117c to input line 111. ESD structure 100 includes a one-to-one correspondence between second plurality of switching devices 119a-119c and second plurality of diodes 117a-117c. In some embodiments, a single switching device is configured to selectively connect more than one diode to input line 111.

In some embodiments, at least one switching device of second plurality of switching devices 119a-119c includes a metal fuse, a polysilicon fuse, a complementary transmission gate, a p-type transmission gate, an n-type transmission gate, an LC resonator, or another suitable switching devices. In some embodiments, the LC resonator includes an inductor connected in parallel with a capacitor. In some embodiments, the LC resonator includes an inductor connected in series with a capacitor. In some embodiments, a design of switching device 117a is a same design as at least one of switching device 119b or switching device 119c. In some embodiments, the design of switching device 119a is different from the design of at least one of switching device 119b or switching device 119c.

In some embodiments, all switching devices of second plurality of switching 119a-119c have a same design as all switching devices of first plurality of switching devices 115a-115b. In some embodiments, at least one switching device of second plurality of switching devices 119a-119c has a different design from at least one switching device of first plurality of switching devices 115a-115b. ESD structure 100 includes fewer switching devices in first plurality of switching devices 115a-115b than in second plurality of switching devices 119a-119c. In some embodiments, first plurality of switching devices 115a-115b includes a same number of switching devices as second plurality of switching devices 119a-119c. In some embodiments, first plurality of switching devices 115a-115b includes more switching devices than second plurality of switching devices 119a-119c.

Reference voltage 120 is usable to dissipate an ESD event received at input pad 110. In some embodiments, reference voltage 120 is ground, i.e., 0 volts (V). In some embodiments, reference voltage 120 is greater than 0V. In some embodiments, reference voltage 120 is less than 0V. In some embodiments, reference voltage 120 is provided by external circuitry.

Reference voltage line 121 is configured to carry a signal from other elements of ESD structure 100 to reference voltage 120. In some embodiments, reference voltage line 121 is part of an interconnect structure.

Operational voltage 130 is usable to dissipate an ESD event received at input pad 110. In some embodiments, operational voltage 130 is voltage drain drain (VDD). In some embodiments, operational voltage 130 is determined based on a threshold voltage of devices within the functional circuit. In some embodiments, operational voltage 130 is provided by external circuitry.

Operational voltage line 131 is configured to carry a signal from other elements of ESD structure 100 to operational voltage 130. In some embodiments, operational voltage line 131 is part of an interconnect structure.

Figure 2:
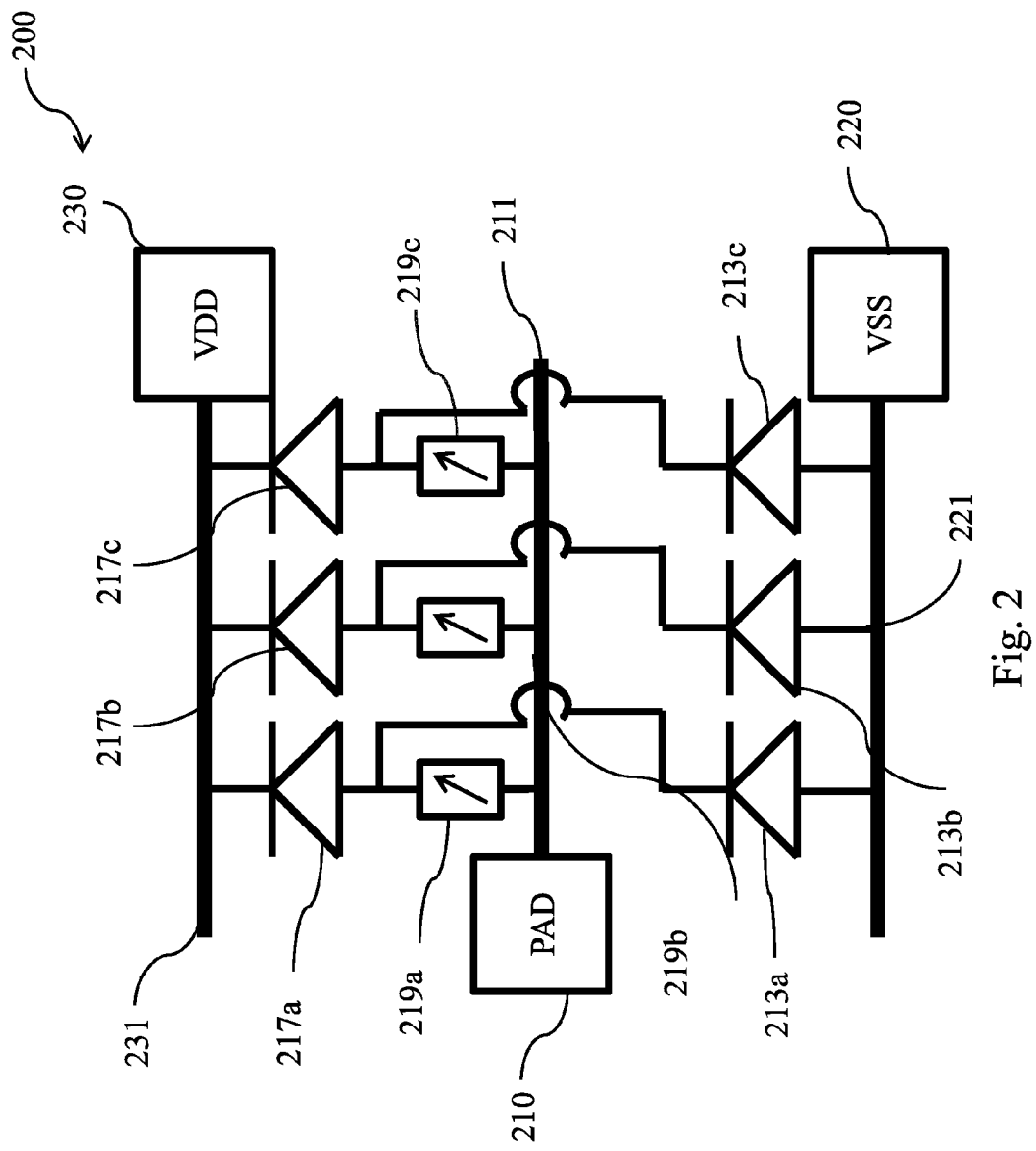
FIG. 2 is a schematic diagram of an ESD structure in accordance with some embodiments.

FIG. 2 is a schematic diagram of an ESD structure 200 in accordance with some embodiments. ESD structure 200 is similar to ESD structure 100 (FIG. 1), non-limiting examples of distinctions between ESD structure 200 and ESD structure 100 are discussed below. Same elements have a same reference number increased by 100. In comparison with ESD structure 100, ESD structure 200 includes a permanent electrical connection between a diode of first plurality of diodes 213a-213c and a corresponding diode of second plurality of diodes 217a-217c. A single switching device of second plurality of switching devices 219a-219c is configured to selectively connect both corresponding diodes to input line 211. For example, switching device 219a is configured to selectively connect both diode 213a and diode 217a to input line 211. Although, in FIG. 2, ESD structure 200 includes three of the first plurality of diodes and three of the second plurality of diodes, any number of the first plurality of diodes or the second plurality of diodes is within the scope of various embodiments.

In comparison with ESD structure 100, ESD structure 200 omits first plurality of switching devices. In some embodiments, ESD structure 200 includes first plurality of switching devices and omits at least one switching device of second plurality of switching devices 219a-219c.

Diodes which are permanently electrically connected have a same dissipation capability. For example, a power dissipation capability of diode 217a is equal to a power dissipation capability of diode 213a. In some embodiments, diode 217a has a same power dissipation capability as diode 217b and diode 217c. In some embodiments, diode 217a has a different power dissipation capability from at least one of diode 217b or diode 217c.

ESD structure 200 includes a one-to-one correspondence between diodes in first plurality of diodes 213a-213c and second plurality of diodes 217a-217c. In some embodiments, ESD structure 200 includes a greater number of diodes in first plurality of diodes 213a-213c than second plurality of diodes 217a-217c. In some embodiments, ESD structure 200 includes a lesser number of diodes in first plurality of diodes 213a-213c than second plurality of diodes 217a-217c. In some embodiments, which lack a one-to-one correspondence of first plurality of diodes 213a-213c to second plurality of diodes 217a-217c, at least three diodes are selectively connected to input line 211 by a single switching device. For example, switching device 219a is configured to selectively connect diode 213a, diode 217a and an additional diode to input line 211, in some embodiments. In some embodiments, which lack a one-to-one correspondence of first plurality of diodes 213a-213c to second plurality of diodes 217a-217c, at least one diode does not share a switching device with another diode. For example, diode 213c is omitted, and switching device 219c is configured to selectively connect only diode 217c to input line 211, in some embodiments.

Figure 3:
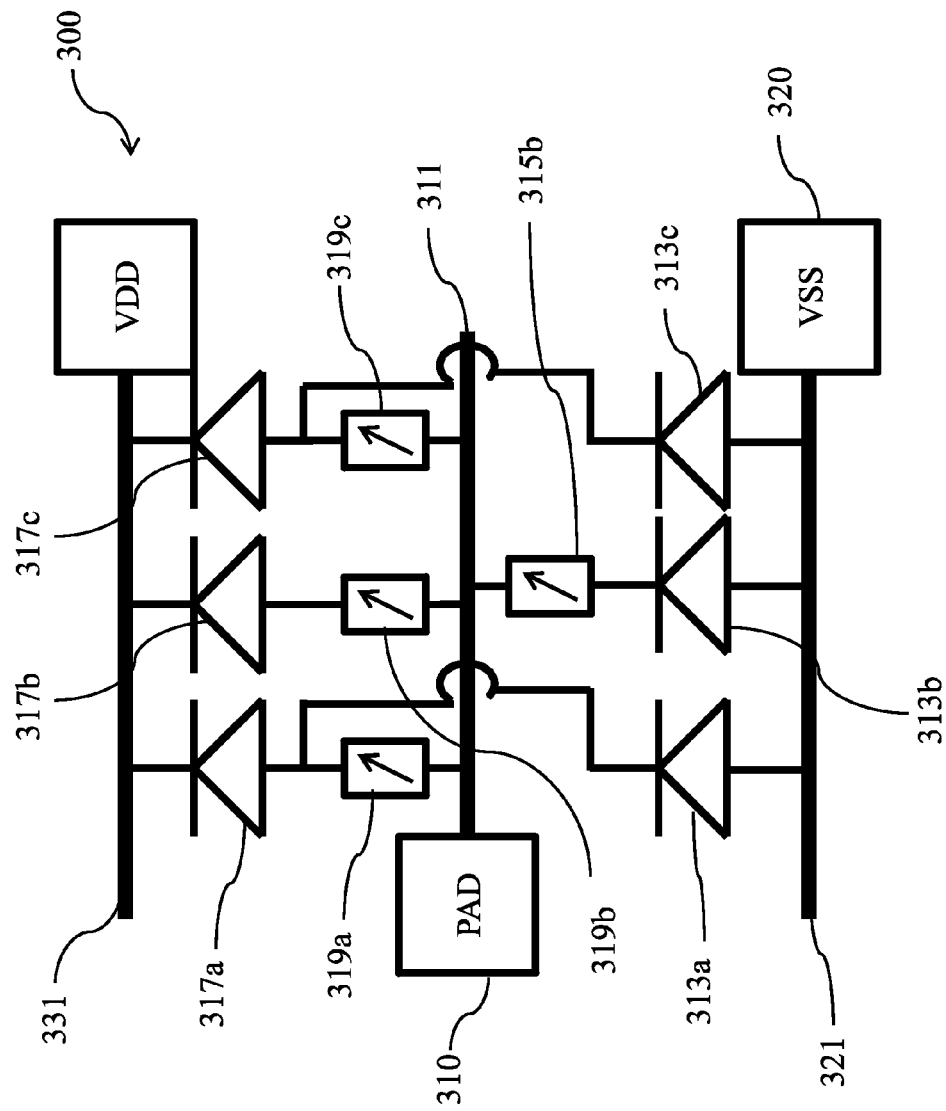
FIG. 3 is a schematic diagram of an ESD structure in accordance with some embodiments.

FIG. 3 is a schematic diagram of an ESD structure 300 in accordance with some embodiments. ESD structure 300 is similar to ESD structure 100 (FIG. 1), non-limiting examples of distinctions between ESD structure 300 and ESD structure 100 are discussed below. Same elements have a same reference number increased by 200. In comparison with ESD structure 100, ESD structure 300 includes several diodes which are in permanent electrical connection and several diodes which are separately connectable to input line 311. Switching device 319a is configured to selectively connect both diode 317a and diode 313a to input line 311. Switching device 319b is configured to selective connect diode 317a to input line 311. Switching device 319c is configured to selectively connect both diode 317c and diode 313c to input line 311. Switching device 313b is configured to selectively connect diode 313b to input line 311. Diodes which are permanently electrically connected have a same dissipation capability. Although, in FIG. 3, ESD structure 300 includes three of the first plurality of diodes and three of the second plurality of diodes, any number of the first plurality of diodes or the second plurality of diodes is within the scope of various embodiments.

ESD structure 300 includes a one-to-one correspondence of diodes which are individually connectable to input line 311. In some embodiments, ESD structure 300 includes a greater number of individually connectable diodes for connecting input line 311 to reference voltage line 321. In some embodiments, ESD structure 300 includes a greater number of individually connectable diodes for connecting input line 311 to operational voltage line 331.

ESD structure 300 includes a one-to-one correspondence of diodes which are collectively connectable to input line 311. In some embodiments, ESD structure 300 includes a greater number of collectively connectable diodes for connecting input line 311 to reference voltage line 321. In some embodiments, ESD structure 300 includes a greater number of collectively connectable diodes for connecting input line 311 to operational voltage line 331. In some embodiments, which lack a one-to-one correspondence of collectively connectable first plurality of diodes 313a-313c to second plurality of diodes 317a-317c, at least three diodes are selectively connected to input line 311 by a single switching device.

Figure 4:
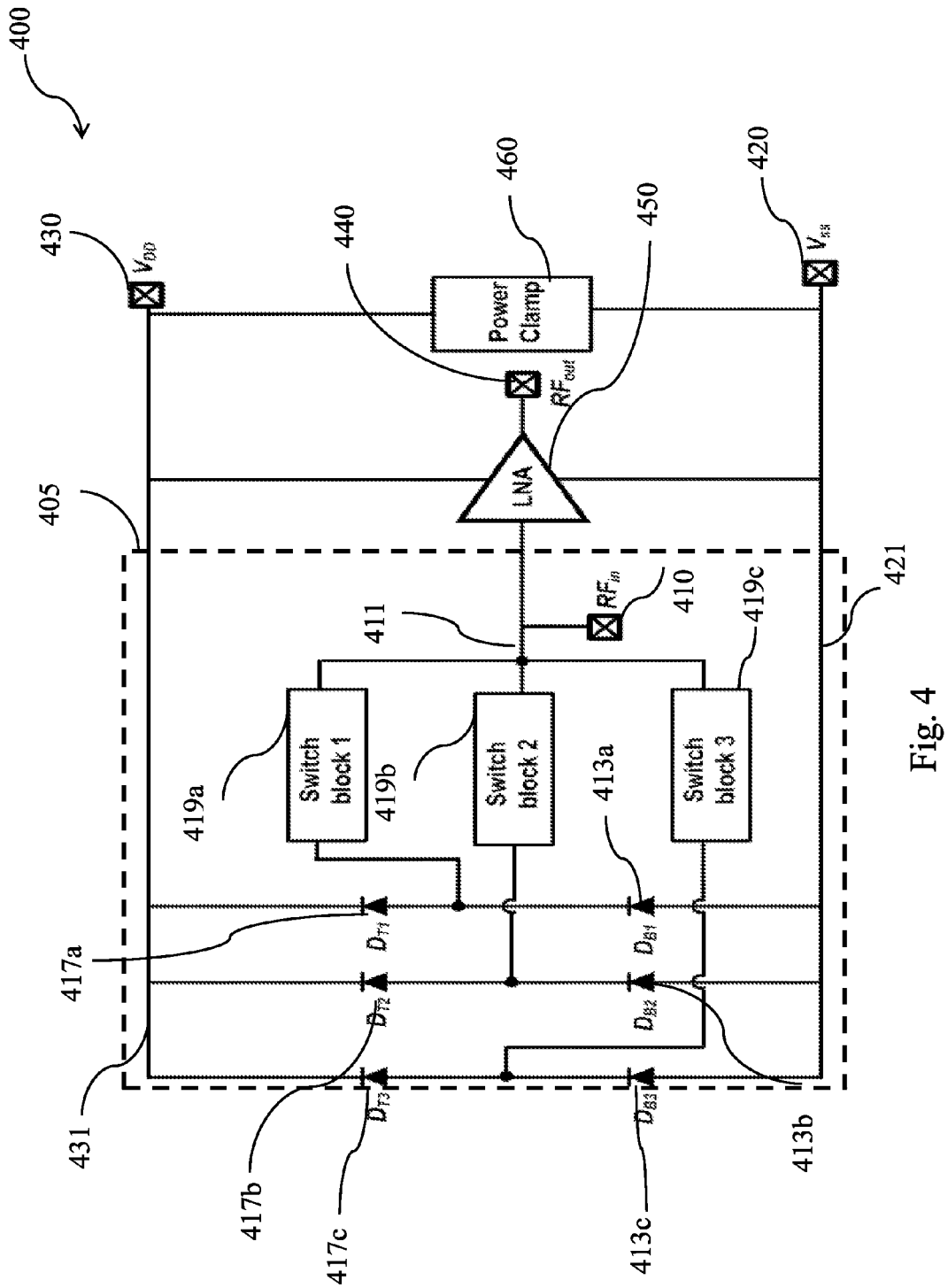
FIG. 4 is a schematic diagram of a circuit including an ESD structure in accordance with some embodiments.

FIG. 4 is a schematic diagram of a circuit 400 including an ESD structure 405 in accordance with some embodiments. ESD structure 405 is similar to ESD structure 200 (FIG. 2), non-limiting examples of distinctions between ESD structure 405 and ESD structure 200 are discussed below. Same elements have a same reference number increased by 200. In addition to ESD structure 405, circuit 400 includes a low noise amplifier (LNA) 450 connected to input pad 410 and a power clamp 430 connected to operational voltage 430 and reference voltage 420. LNA 450 and power clamp 460 are examples of functional circuits. ESD structure 405 is configured to protect LNA 450 and power clamp 460 during an ESD event. In some embodiments, circuit 400 includes different functional circuits from LNA 450 or power clamp 460. In some embodiments, the functional circuits include memory cells, logic devices, clock signal generating devices, analog-to-digital converters (ADCs), digital-to-analog converters (DACs), flip-flops, counters, or other suitable functional circuits.

Figure 5:
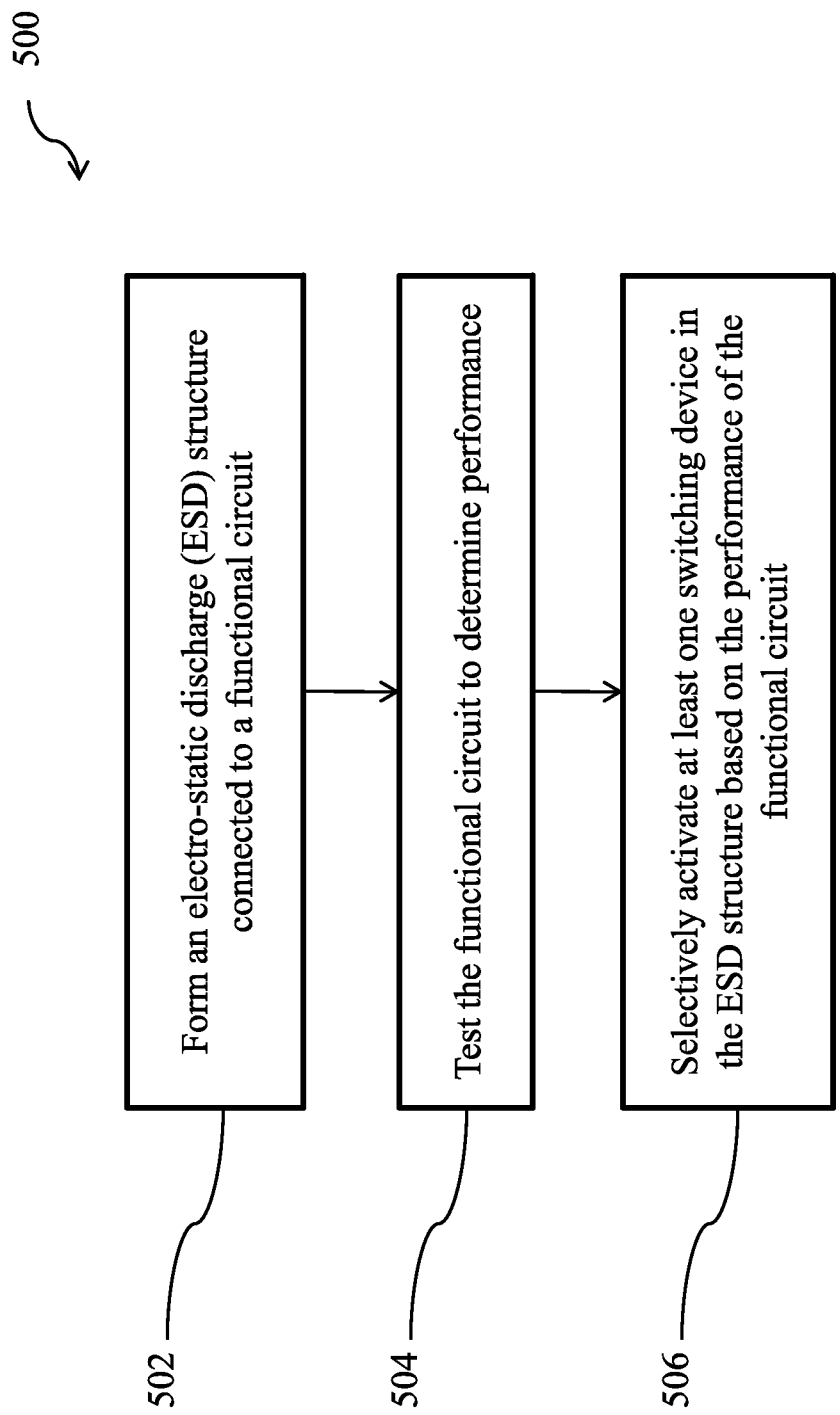
FIG. 5 is a flowchart of a method of using an ESD structure in accordance with some embodiments.

FIG. 5 is a flowchart of a method 500 of using an ESD structure in accordance with some embodiments. Method 500 begins with operation 502 in which an ESD structure is connected to a functional circuit. In some embodiments, the ESD structure is ESD structure 100 (FIG. 1), ESD structure 200 (FIG. 2), ESD structure 300 (FIG. 3), ESD structure 405 (FIG. 4) or another suitable ESD structure. The ESD structure is connected to the functional circuit by an input bus, e.g., input line 111, input line 211, input line 311 or input line 411, or another suitable input bus. In some embodiments, the input bus is in a same chip as both the ESD structure and the functional circuit. In some embodiments, the input bus is in a different chip from at least one of the ESD structure or the functional circuit. In some embodiments, the input bus is in an interposer.

Method 500 continues with operation 504 in which the functional circuit is tested to determine a performance of the functional circuit. The functional circuit is tested following manufacturing to provide a more accurate measurement of the performance of the functional circuit.

In operation 506, at least one switching device of the ESD structure is selectively activated based on the performance of the functional circuit. In some embodiments, the switching device includes at least one of a first plurality of switching devices, e.g., first plurality of switching devices 115a-115b (FIG. 1), first plurality of switching devices 315b (FIG. 3), or another suitable switching device. In some embodiments, the switching device includes at least one of a second plurality of switching devices, e.g., second plurality of switching devices 119a-119c, second plurality of switching devices 219a-219c (FIG. 2), second plurality of switching devices 319a-319c, second plurality of switching devices 419a-419c (FIG. 4), or another suitable switching device.

Selectively activating includes changing a number of dissipation paths within the ESD structure. In some embodiments, the selective activation includes de-activation, such as breaking a fuse, to reduce a number of dissipation paths. In some embodiments, the selective activation includes dynamic activation. Dynamic activation permits regular measurement of performance of the functional circuit and then selective activation or de-activation of one or more switching devices.

One aspect of this description relates to an electro-static discharge (ESD) structure. The ESD structure includes an input pad, and a first switching device electrically connected to the input pad. The ESD structure further includes a first diode, wherein the first switching device is configured to selectively connect the first diode to the input pad, and the first diode is configured to provide a first dissipation path for an ESD event at the input pad. The ESD structure further includes a second diode selectively connectable to the input pad, wherein the second diode is configured to provide a second dissipation path for the ESD event at the input pad.

Another aspect of this description relates to a circuit. The circuit includes a functional circuit, and an electro-static discharge (ESD) structure configured to protect the functional circuit during an ESD event. The ESD structure includes an input pad, and a plurality of first switching devices electrically connected to the input pad. The ESD structure includes a plurality of first diodes, wherein each first switching device of the plurality of first switching devices is configured to selectively connect at least one corresponding first diode of the plurality of first diodes to the input pad. The ESD structure further includes at least one second diode selectively connectable to the input pad.

Still another aspect of this description relates to a method of using an electro-static discharge (ESD) structure. The method includes determining a performance of a functional circuit connected to the ESD structure. The method further includes selectively activating at least one switching device in the ESD structure based on the determined performance, wherein selectively activating the at least one switching device comprises adjusting a number of dissipation paths within the ESD structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electro-static discharge (ESD) structure comprising:
   an input pad;
   a plurality of diodes, including a first diode and a second diode, electrically connected in parallel in a forward bias direction and to the input pad, wherein each diode of the plurality of diodes is configured to provide a corresponding dissipation path in the forward bias direction in response to an ESD event of a first polarity at the input pad;
   a first switch coupled to the first diode, and a second switch coupled to the second diode, wherein the first and second switches are each selectively actuatable based on a magnitude of a power dissipation requirement; and
   a third diode selectively connectable to the input pad, wherein the third diode is configured to provide a dissipation path in response to an ESD event of a second polarity at the input pad, wherein the second polarity is opposite the first polarity.

2. The ESD structure of claim 1, further comprising a switching device electrically connected to the input pad, wherein the switching device is configured to selectively connect the third diode to the input pad.

3. The ESD structure of claim 2, further comprising a fourth diode, wherein the switching device is configured to selectively connect the fourth diode to the input pad.

4. The ESD structure of claim 1, further comprising a voltage bus, wherein at least one of the first, second, or third diode is electrically connected to the voltage bus.

5. The ESD structure of claim 1, further comprising:
an operational voltage bus, wherein the operational voltage bus is electrically connected to the first diode of the plurality of diodes; and
a reference voltage bus, wherein the reference voltage bus is electrically connected to the third diode.

6. The ESD structure of claim 2, wherein the switching device is configured to selectively connect the second diode to the input pad.

7. The ESD structure of claim 2, wherein the switching device comprises a metal fuse, a polysilicon fuse, a complementary transmission gate, a p-type transmission gate, an n-type transmission gate, or an LC resonator.

8. The ESD structure of claim 1, wherein the channel dimension of the first diode is equal to a channel dimension of the third diode.

9. The ESD structure of claim 1, wherein the channel dimension of the first diode is different from a channel dimension of the third diode.

10. The ESD structure of claim 1, wherein the first diode is permanently connected to the third diode.

11. The ESD structure of claim 1, wherein the first diode has p-type conductivity and the third diode has n-type conductivity.

12. A circuit comprising:
a functional circuit; and
an electro-static discharge (ESD) structure configured to protect the functional circuit during an ESD event, wherein the ESD structure comprises:
an input pad;
a plurality of first switching devices electrically connected to the input pad;
a plurality of first diodes coupled to the input pad in a forward bias direction, wherein each first switching device of the plurality of first switching devices is configured to selectively connect at least one corresponding first diode of the plurality of first diodes to the input pad; and
at least one second diode selectively connectable to the input pad in a reverse bias direction, wherein one of the plurality of first diodes or the at least one second diode is configured to dissipate a positive ESD event, and the other of the plurality of first diodes or the at least one second diode is configured to dissipate a negative ESD event.

13. The circuit of claim 12, further comprising at least one second switching device electrically connected to the input pad, wherein the at least one second switching device is configured to selectively connect a corresponding second diode of the at least one second diode to the input pad, and the at least one second switching device is separate from the plurality of first switching devices.

14. The circuit of claim 13, wherein one second diode of the at least one second diode is permanently connected to a first diode of the plurality of first diodes, and another second diode of the at least one second diode is connected to the at least one second switching device.

15. The circuit of claim 12, wherein a first switching device of the plurality of first switching devices is configured to selectively connect more than one first diode of the plurality of first diodes to the input pad.

16. The circuit of claim 12, wherein a first switching device of the plurality of first switching devices is configured to selectively connect the at least one second diode to the input pad.

17. The circuit of claim 12, wherein a number of first diodes of the plurality of first diodes is equal to a number of second diodes of the at least one second diode.

18. The circuit of claim 12, wherein each first switching device of the plurality of first switching devices independently comprises a metal fuse, a polysilicon fuse, a complementary transmission gate, a p-type transmission gate, an n-type transmission gate, or an LC resonator.

19. The circuit of claim 12, wherein one first diode of the plurality of first diodes has a different channel dimension from another first diode of the plurality of first diodes.

20. The circuit of claim 12, wherein one first diode of the plurality of first diodes has a same channel dimension as another first diode of the plurality of first diodes.

21. A method of using an electro-static discharge (ESD) structure, wherein the method comprises:
determining a performance of a functional circuit connected to the ESD structure; and
selectively activating at least one switching device in the ESD structure based on the determined performance, wherein selectively activating the at least one switching device comprises setting a number of dissipation paths for ESD events of first and second polarities and based on a power dissipation requirement, wherein the dissipation paths are through parallel-connected diodes and in a forward biased direction within the ESD structure.

* * * * *